United States Patent
Lee

(10) Patent No.: US 8,625,366 B2
(45) Date of Patent: Jan. 7, 2014

(54) NEGATIVE HIGH VOLTAGE GENERATOR AND NON-VOLATILE MEMORY DEVICE INCLUDING NEGATIVE HIGH VOLTAGE GENERATOR

(75) Inventor: Seung-Won Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 144 days.

(21) Appl. No.: 13/325,876

(22) Filed: Dec. 14, 2011

(65) Prior Publication Data

US 2012/0155208 A1 Jun. 21, 2012

(30) Foreign Application Priority Data

Dec. 15, 2010 (KR) .................. 10-2010-0128120

(51) Int. Cl.
*G11C 5/14* (2006.01)
*G11C 7/00* (2006.01)
*G05F 1/10* (2006.01)
*G05F 3/02* (2006.01)

(52) U.S. Cl.
USPC .................. 365/189.09; 365/189.11; 327/536

(58) Field of Classification Search
USPC .................. 365/189.09, 189.11; 327/536
See application file for complete search history.

(56) References Cited

U.S. PATENT DOCUMENTS

| | | | | |
|---|---|---|---|---|
| 5,886,566 A | * | 3/1999 | Park et al. | 327/536 |
| 6,023,188 A | * | 2/2000 | Lee et al. | 327/536 |
| 6,633,287 B1 | | 10/2003 | Yatabe et al. | |
| 6,803,807 B2 | | 10/2004 | Doi et al. | |
| 8,253,613 B2 | * | 8/2012 | Holcombe | 341/143 |
| 2006/0028266 A1 | * | 2/2006 | Tobita | 327/536 |

FOREIGN PATENT DOCUMENTS

| | | |
|---|---|---|
| JP | 2001051662 A | 2/2001 |
| JP | 2003235245 A | 8/2003 |
| JP | 2009303449 A | 12/2009 |

* cited by examiner

*Primary Examiner* — Ly D Pham
(74) *Attorney, Agent, or Firm* — Volentine & Whitt, PLLC

(57) ABSTRACT

A negative high voltage generator includes a charge providing unit and a voltage conversion unit. The charge providing unit is configured to periodically output a predetermined amount of positive charges received from a supply voltage. The voltage conversion unit is configured to store the positive charges and to discharge the stored positive charges to a ground voltage to generate a negative high voltage having a magnitude larger than a magnitude of the supply voltage.

14 Claims, 12 Drawing Sheets

NEGATIVE HIGH VOLTAGE GENERATOR AND NON-VOLATILE MEMORY DEVICE INCLUDING NEGATIVE HIGH VOLTAGE GENERATOR

CROSS-REFERENCE TO RELATED APPLICATION

A claim of priority under 35 U.S.C. §119 is made to Korean Patent Application No. 10-2010-0128120, filed on Dec. 15, 2010, in the Korean Intellectual Property Office, the entire contents of which are hereby incorporated by reference.

BACKGROUND

Embodiments relate to a negative high voltage generator, and more particularly to a negative high voltage generator that is small in size, and a non-volatile memory device including the negative high voltage generator.

Generally, magnitude of a negative supply voltage is amplified using pumping stages, each of which includes an N-type metal oxide semiconductor (NMOS) transistor formed on a P+ type silicon substrate to generate a negative high voltage. Each of the NMOS transistors included in the pumping stages amplifies a magnitude of a negative voltage received from a previous pumping stage and provides the amplified negative voltage to a next pumping stage.

Usually, when a negative high voltage is applied to an NMOS transistor, leakage current flows from a drain region of the NMOS transistor to a P+ type silicon substrate, so that the NMOS transistor cannot sufficiently amplify the magnitude of the negative high voltage. To prevent the leakage current, a P+ type well surrounding a source region and a drain region of the NMOS transistor, and an N+ type well surrounding the P+ type well is formed in the P+ type silicon substrate in a conventional negative high voltage generator, an example of which is shown in FIG. 11.

SUMMARY

Various embodiments are directed to a negative high voltage generator that uses a positive supply voltage to generate a negative high voltage. Various embodiments are directed to a non-volatile memory device including the negative high voltage generator.

According to various embodiments, a negative high voltage generator includes a charge providing unit and a voltage conversion unit. The charge providing unit is configured to periodically output a predetermined amount of positive charges received from a supply voltage. The voltage conversion unit is configured to store the positive charges and to discharge the stored positive charges to a ground voltage to generate a negative high voltage having a magnitude larger than a magnitude of the supply voltage.

The voltage conversion unit may include first, second and third switch units and a coupling capacitor. The first switch unit is configured to turn on in response to a first control signal to transfer the positive charges. The coupling capacitor has a first electrode and a second electrode, and is configured to store the positive charges received from the first switch unit at the first electrode and to provide the negative high voltage at the second electrode. The second switch unit is configured to turn on in response to a second control signal to discharge the stored positive charges from the first electrode of the coupling capacitor to the ground voltage. The third switch unit is configured to turn on in response to a third control signal to connect the second electrode of the coupling capacitor to the ground voltage.

The first switch unit may include a first level shifter and a P-type metal oxide semiconductor (PMOS) transistor. The first level shifter is configured to receive the first control signal and to change a voltage level of the first control signal in a logic high state. The PMOS transistor has a gate for receiving an output signal of the first level shifter, a source for receiving the positive charges and a drain connected to the first electrode of the coupling capacitor.

The second switch unit may include an N-type metal oxide semiconductor (NMOS) transistor having a gate for receiving the second control signal, a drain connected to the first electrode of the coupling capacitor and a source connected to the ground voltage.

The third switch unit may include a second level shifter and an NMOS transistor. The second level shifter is configured to receive the third control signal and to change a voltage level of the third control signal to a logic low state. The NMOS transistor has a gate for receiving an output signal of the second level shifter, a drain connected to the second electrode of the coupling capacitor and a source connected to the ground voltage.

The first switch unit and the third switch unit may be turned on and the second switch unit may be turned off to store the positive charges at the first electrode of the coupling capacitor during a first operation period. Also, the first switch unit and the third switch unit may be turned off and the second switch unit may be turned on to discharge the stored positive charges from the first electrode of the coupling capacitor to the ground voltage during a second operation period.

The first switch unit may be turned off, the third switch unit may be turned off, and then the second switch unit may be turned on in that order during a first transition period, the first transition period being after the first operation period and before the second operation period/ The second switch unit may be turned off, the third switch unit may be turned on, and then the first switch unit may be turned on in that order during a second transition period, the second transition period being after the second operation period and before the first operation period.

The voltage conversion unit may provide the negative high voltage at the second electrode of the coupling capacitor during the second operation period. The charge providing unit may stop outputting the positive charges during the second operation period.

The voltage conversion unit may further include a diode having a cathode and an anode. The cathode of the diode may be connected to the second electrode of the coupling capacitor such that the diode receives the negative high voltage from the second electrode of the coupling capacitor at the cathode and provides the negative high voltage to an external device at the anode.

The charge providing unit of the negative high voltage generator may include NMOS transistors connected in series and boost capacitors. Each of the NMOS transistors may be diode connected, a first NMOS transistor that is connected at first stage among the NMOS transistors receiving the supply voltage. The boost capacitors respectively include first and second electrodes, the first electrodes being connected to nodes between adjacent NMOS transistors of the plurality of NMOS transistors, respectively.

The second electrodes of first boost capacitors, connected at odd stages among the plurality of boost capacitors, may receive a first clock signal, and the second electrodes of second boost capacitors, connected at even stages among the boost capacitors, may receive a second clock signal. The second clock signal may be an inverted version of the first clock signal, where the first clock signal and the second clock signal toggle between the ground voltage and the supply voltage. A last NMOS transistor, connected at a last stage among the NMOS transistors, may output the positive charges at a rising edge and a falling edge of the first clock signal and the second clock signal, respectively.

Each of the NMOS transistors may include an N+ type source and an N+ type drain that are directly formed in a P+ type substrate.

According to various embodiments, A non-volatile memory device includes a memory cell array having multiple memory cells, a row decoder configured to provide an operating voltage and a negative high voltage to the memory cell array to perform at least one of a program operation, a program verification operation and a read operation on the memory cell array, and a voltage providing unit. The voltage providing unit includes an operating voltage generator configured to generate the operating voltage and a negative high voltage generator configured to generate the negative high voltage. The negative high voltage generator includes a charge providing unit configured to periodically output a predetermined amount of positive charges received from a supply voltage, and a voltage conversion unit configured to store the positive charges and discharge the stored positive charges to a ground voltage to generate the negative high voltage having a magnitude larger than a magnitude of the supply voltage.

The voltage conversion unit of the negative high voltage generator may includes first through third switch units and a coupling capacitor. The first switch unit is configured to selectively transfer positive charges in response to a first control signal. The coupling capacitor has a first electrode and a second electrode, and is configured to store the positive charges received from the first switch unit at the first electrode and to provide the negative high voltage at the second electrode. The second switch unit is configured to selectively discharge the stored positive charges from the first electrode of the coupling capacitor to the ground voltage in response to a second control signal. The third switch unit is configured to selectively connect the second electrode of the coupling capacitor to the ground voltage in response to a third control signal.

According to various embodiments, a method is provide for generating a negative high voltage using a voltage conversion unit including a coupling capacitor having first and second electrodes. The method includes connecting the second electrode of the coupling capacitor to a ground voltage; periodically storing positive charges from a supply voltage at the first electrode of the coupling capacitor, causing a voltage of the first electrode of the coupling capacitor to increase to a positive high voltage having a magnitude larger than a magnitude of the supply voltage; and disconnecting the second electrode of the coupling capacitor from the ground voltage and connecting the first electrode of the coupling capacitor to the ground voltage, causing the voltage of the first electrode to decrease from the positive high voltage to the ground voltage and the voltage of the second electrode of the coupling capacitor to decrease from the ground voltage to the negative high voltage.

The magnitude of the negative high voltage may be substantially the same as a magnitude of the positive high voltage.

BRIEF DESCRIPTION OF THE DRAWINGS

Illustrative embodiments will be more clearly understood from the following detailed description taken in conjunction with the accompanying drawings.

DETAILED DESCRIPTION OF THE EMBODIMENTS

Figure 1:
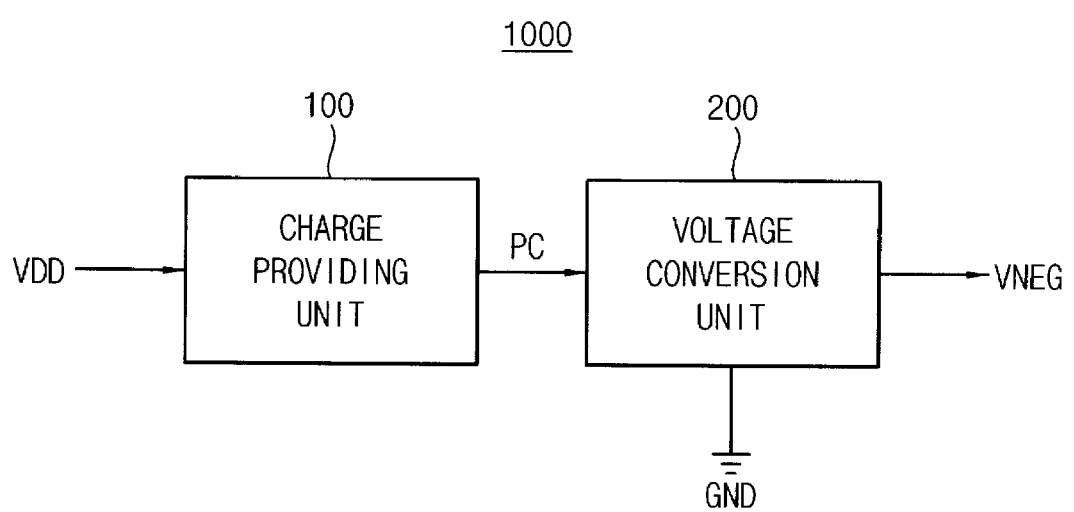
FIG. 1 is a block diagram showing a negative high voltage generator, according to illustrative embodiments.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms first, second, etc., may be used herein to describe various elements, these elements should not be limited by these terms. These terms are used to distinguish one element from another. For example, a first element could be termed a second element, and similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram showing a negative high voltage generator, according to illustrative embodiments.

Referring to FIG. 1, a negative high voltage generator 1000 includes a charge providing unit 100 and a voltage conversion unit 200. The charge providing unit 100 periodically outputs a predetermined amount of positive charges PC received from supply voltage VDD. The supply voltage VDD is a positive voltage. The voltage conversion unit 200 stores the positive charges PC and discharges the stored positive charges to ground voltage GND to generate a negative high voltage VNEG having a magnitude larger than a magnitude of the supply voltage VDD. That is, the negative high voltage VNEG is a negative voltage.

Figure 2:
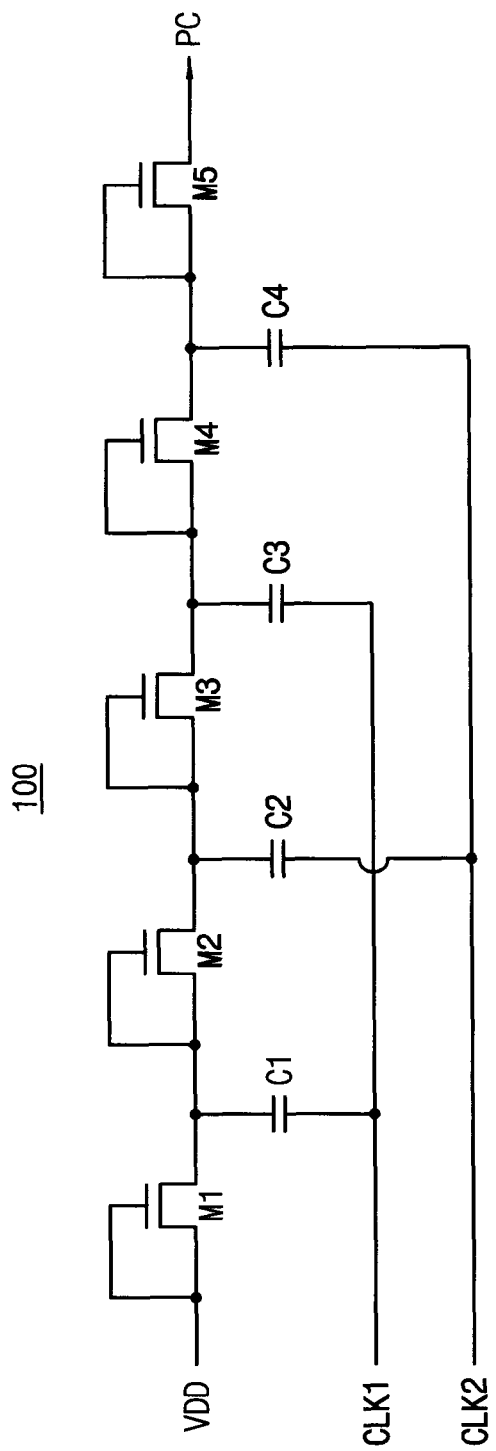
FIG. 2 is a block diagram showing an example of a charge providing unit of FIG. 1, according to an illustrative embodiment.

FIG. 2 is a block diagram showing an example of the charge providing unit of FIG. 1, according to an illustrative embodiment.

Referring to FIG. 2, the charge providing unit 100 includes multiple N-type metal oxide semiconductor (NMOS) transistors M1, M2, M3, M4 and M5, and multiple boost capacitors C1, C2, C3 and C4. In FIG. 2, the charge providing unit 100 includes five NMOS transistors M1, M2, M3, M4 and M5 and four boost capacitors C1, C2, C3 and C4 as an example. Generally, the charge providing unit 100 may include (n+1) NMOS transistors and n boost capacitors, where n is a positive integer.

The NMOS transistors M1, M2, M3, M4 and M5 are connected in series. For example, drains of the NMOS transistors M2, M3, M4 and M5 may be connected to sources of adjacent NMOS transistors M1, M2, M3 and M4, respectively. In an embodiment, each of the NMOS transistors M1, M2, M3, M4 and M5 are diode connected. For example, a gate and a source of each of the NMOS transistors M1, M2, M3, M4 and M5 may be connected to each other, so that each of the NMOS transistors M1, M2, M3, M4 and M5 operates as a diode.

First electrodes of the boost capacitors C1, C2, C3 and C4 are connected to nodes between adjacent NMOS transistors M1, M2, M3, M4 and M5, respectively. For example, a first electrode of a first boost capacitor C1 may be connected to a node between the first NMOS transistor M1 and the second NMOS transistor M2. A first electrode of a second boost capacitor C2 may be connected to a node between the second NMOS transistor M2 and the third NMOS transistor M3. A first electrode of a third boost capacitor C3 may be connected to a node between the third NMOS transistor M3 and the fourth NMOS transistor M4. A first electrode of a fourth boost capacitor C4 may be connected to a node between the fourth NMOS transistor M4 and the fifth NMOS transistor M5.

In the depicted configuration, the supply voltage VDD is applied to the drain of the first NMOS transistor M1. The boost capacitors C1, C2, C3 and C4 store the positive charges PC received from the NMOS transistors M1, M2, M3 and M4, respectively.

The boost capacitors C1, C2, C3 and C4 may be divided into first boost capacitors, which are connected at odd stages (boost capacitors C1 and C3), and boost second capacitors, which are connected at even stages (boost capacitors C2 and C4). Second electrodes of the first boost capacitors C1 and C3 receive a first clock signal CLK1, and second electrodes of the second boost capacitors C2 and C4 receive a second clock signal CLK2.

Figure 3:
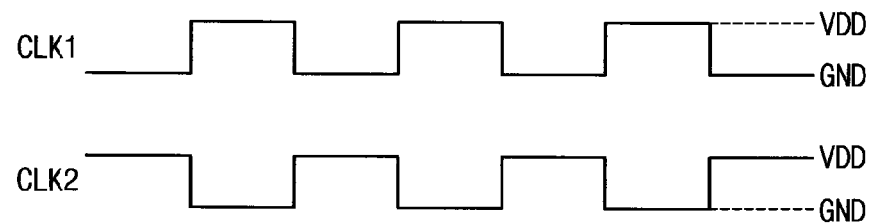
FIG. 3 shows examples of waveforms of first and second clock signals of FIG. 2, according to an illustrative embodiment.

FIG. 3 shows examples of waveforms of first and second clock signals of FIG. 2, according to an illustrative embodiment.

Referring to FIG. 3, the second clock signal CLK2 is an inverted version of the first clock signal CLK1. That is, the frequency of the second clock signal CLK2 is the same as the frequency of the first clock signal CLK1, while the phase of the second clock signal CLK2 differs from the phase of the first clock signal CLK1 by 180 degrees. The first clock signal CLK1 and the second clock signal CLK2 toggle between the ground voltage GND and the supply voltage VDD, for example.

Hereinafter, operation of the charge providing unit 100 will be described with reference to FIGS. 1 to 3.

The boost capacitors C1, C2, C3 and C4 store the positive charges PC received from the NMOS transistors M1, M2, M3 and M4, and provide the stored positive charges PC to the NMOS transistors M2, M3, M4 and M5, respectively, in synchronization with the first clock signal CLK1 and the second clock signal CLK2. Therefore, the last NMOS transistor M5, which is connected at the last stage among the NMOS transistors M1, M2, M3, M4 and M5, periodically provides the predetermined amount of the positive charges PC to the voltage conversion unit 200 at a rising edge and a falling edge of the first clock signal CLK1 and the second clock signal CLK2. The predetermined amount is determined by a voltage of the supply voltage VDD and capacitances of the boost capacitors C1, C2, C3 and C4.

Figure 12:
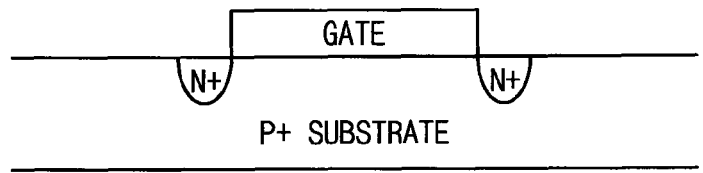
FIG. 12 is a cross-sectional view of an NMOS transistor included in the negative high voltage generator of FIG. 1, according to an illustrative embodiment.

As illustrated in FIG. 12, each of the NMOS transistors M1, M2, M3, M4 and M5 may include an N+ type source and an N+ type drain that are directly formed in a P+ type substrate. The structure of the NMOS transistors M1, M2, M3, M4 and M5 will be further described below with reference to FIG. 12.

Figure 4:
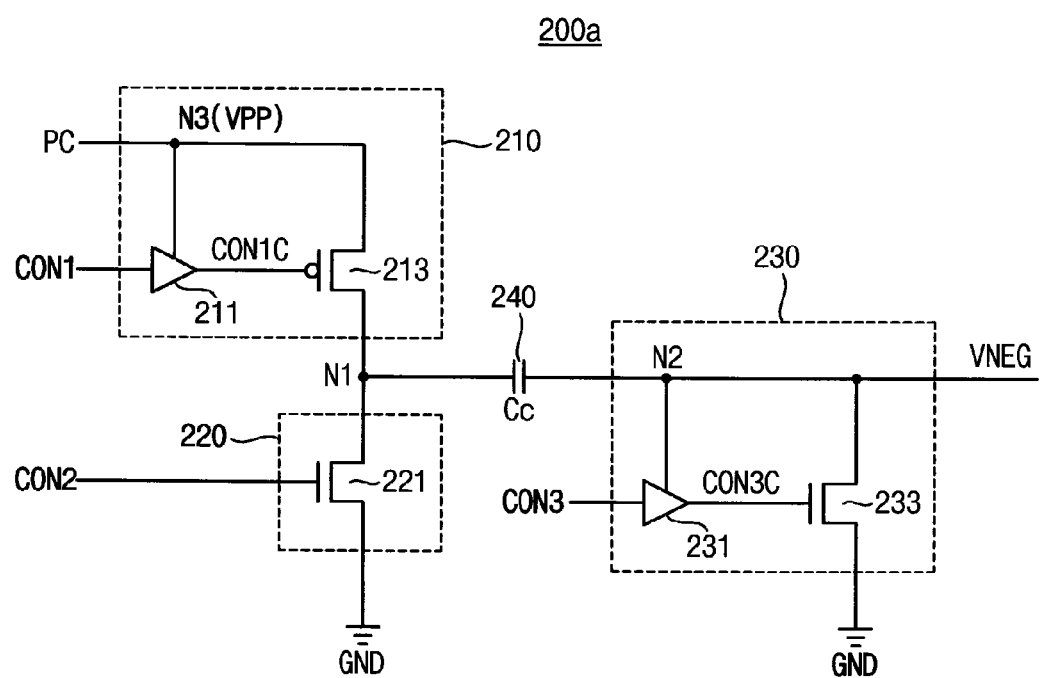
FIG. 4 is a circuit diagram showing an example of a voltage conversion unit of FIG. 1, according to an illustrative embodiment.

FIG. 4 is a circuit diagram showing an example of the voltage conversion unit of FIG. 1, according to an illustrative embodiment.

Referring to FIG. 4, voltage conversion unit 200a includes a first switch unit 210, a second switch unit 220, a third switch unit 230 and a coupling capacitor Cc 240. The first switch unit 210 is connected to the charge providing unit 100 at a third node N3. The first switch unit 210 is turned on and off in response to a first control signal CON1 to selectively transfer the positive charges PC received from the charge providing unit 100 to a first node N1. A first electrode of the coupling capacitor 240 is connected to the first switch unit 210 at the first node N1. The coupling capacitor 240 may store the positive charges PC received from the first switch unit 210 at the first electrode. The coupling capacitor 240 provides the negative high voltage VNEG at a second electrode.

The second switch unit 220 is connected to the first switch unit 210 and to the first electrode of the coupling capacitor 240 at the first node N1. The second switch unit 220 is turned on and off in response to a second control signal CON2 to selectively discharge the stored positive charges from the first electrode of the coupling capacitor 240 to the ground voltage GND.

The third switch unit 230 is connected to the second electrode of the coupling capacitor 240 at a second node N2. The third switch unit 230 is turned on and off in response to a third control signal CON3 to selectively connect the second electrode of the coupling capacitor 240 to the ground voltage GND.

When the first switch unit 210 is turned on, the positive charges PC provided from the charge providing unit 100 are stored at the first electrode of the coupling capacitor 240 through the first switch unit 210, such that a voltage of the first node N1 increases and, consequentially, a voltage of the third node N3 increases. Therefore, the voltage of the third node N3 may be referred to as a positive boosting voltage VPP.

In the depicted embodiment, the first switch unit 210 includes a first level shifter 211 and a P-type metal oxide semiconductor (PMOS) transistor 213. The first level shifter 211 receives the first control signal CON1 and changes a voltage level of the first control signal CON1 in a logic high state to generate a fourth control signal CON1C. The PMOS transistor 213 includes a gate that receives the fourth control signal CON1C, a source connected to the third node N3 to receive the positive charges PC from the charge providing unit 100, and a drain connected to the first electrode of the coupling capacitor 240 at the first node N1.

Figure 5:
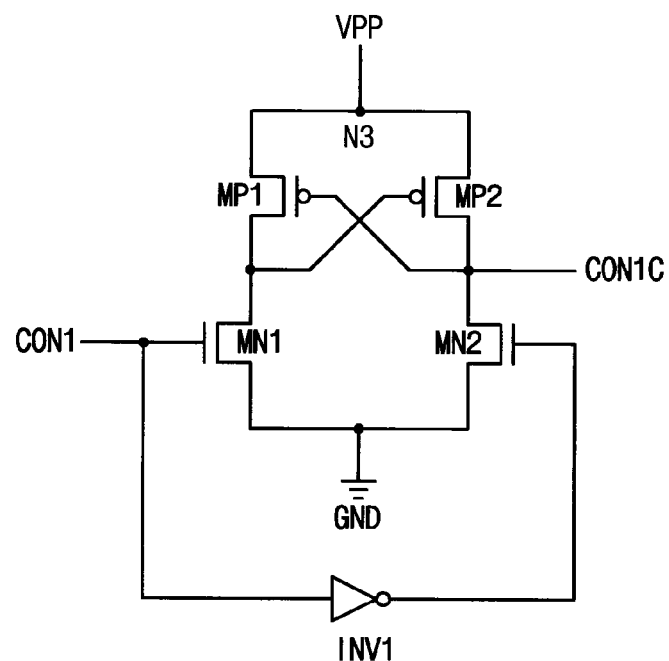
FIG. 5 is a circuit diagram showing an example of the first level shifter included in the first switch unit of FIG. 4, according to an illustrative embodiment.

FIG. 5 is a circuit diagram showing an example of the first level shifter included in the first switch unit of FIG. 4, according to an illustrative embodiment.

Referring to FIG. 5, the first level shifter 211 includes a first NMOS transistor MN1, a second NMOS transistor MN2, a first PMOS transistor MP1, a second PMOS transistor MP2 and a first inverter INV1. The first NMOS transistor MN1 includes a gate receiving the first control signal CON1 and a source connected to the ground voltage GND. The first inverter INV1 inverts the first control signal CON1. The second NMOS transistor MN2 includes a gate receiving an output signal of the first inverter INV1 and a source connected to the ground voltage GND. The first PMOS transistor MP1 includes a source connected to the third node N3 to receive the positive boosting voltage VPP, a gate connected to a drain of the second NMOS transistor MN2 and a drain connected to a drain of the first NMOS transistor MN1. The second PMOS transistor MP2 includes a source connected to the third node N3 to receive the positive boosting voltage VPP, a gate connected to a drain of the first NMOS transistor MN1 and a drain connected to a drain of the second NMOS transistor MN2. The first level shifter 211 outputs the fourth control signal CON1C at the drain of the second NMOS transistor MN2.

Figure 6:
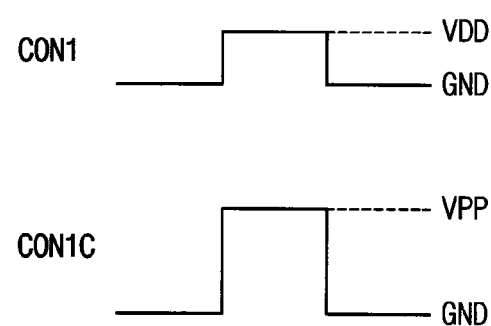
FIG. 6 shows examples of waveforms for describing operation of the first level shifter of FIG. 5, according to an illustrative embodiment.

FIG. 6 shows waveforms for describing operation of the first level shifter of FIG. 5, according to an illustrative embodiment.

Referring to FIGS. 5 and 6, when the first control signal CON1 is in a logic low state having the ground voltage GND, the first NMOS transistor MN1 is turned off and the second NMOS transistor MN2 is turned on, such that a voltage of the drain of the second NMOS transistor MN2 is the ground voltage GND. Therefore, the first level shifter 211 provides the fourth control signal CON1C in a logic low state having the ground voltage GND.

When the first control signal CON1 is in a logic high state having the supply voltage VDD, the first NMOS transistor MN1 is turned on and the second NMOS transistor MN2 is turned off such that a voltage of the drain of the first NMOS transistor MN1 is the ground voltage GND. Since the voltage of the drain of the first NMOS transistor MN1 is the ground voltage GND, the second PMOS transistor MP2 is turned on such that the voltage of the drain of the second NMOS transistor MN2 is the positive boosting voltage VPP. Therefore, the first level shifter 211 provides the fourth control signal CON1C in a logic high state having the positive boosting voltage VPP.

As described above, the first level shifter 211 may receive the first control signal CON1 and change a voltage level of the first control signal CON1 in a logic high state to generate the fourth control signal CON1C.

Referring again to FIG. 4, the second switch unit 220 includes an NMOS transistor 221 having a gate receiving the second control signal CON2, a drain connected to the first electrode of the coupling capacitor 240 at the first node N1, and a source connected to the ground voltage GND.

The third switch unit 230 includes a second level shifter 231 and an NMOS transistor 233. The second level shifter 231 receives the third control signal CON3 and changes a voltage level of the third control signal CON3 in a logic low state to generate a fifth control signal CON3C. The NMOS transistor 233 includes a gate receiving the fifth control signal CON3C, a drain connected to the second electrode of the coupling capacitor 240 at the second node N2, and a source connected to the ground voltage GND.

Figure 7:
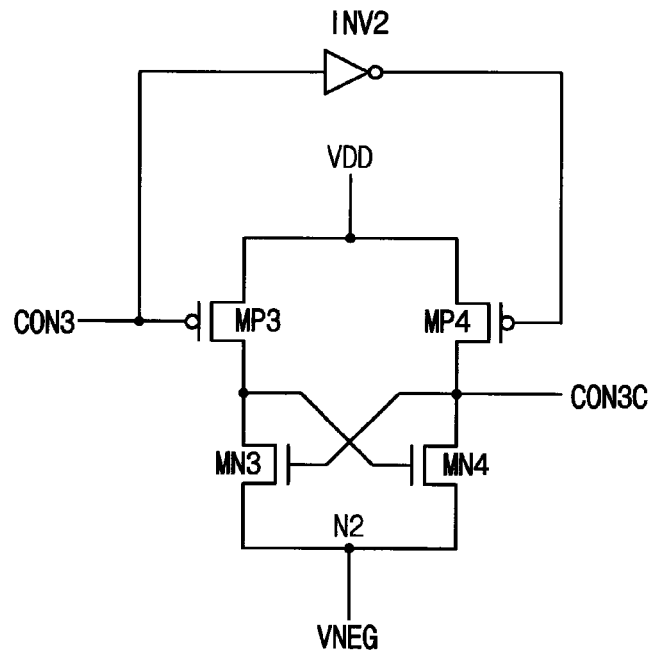
FIG. 7 is a circuit diagram showing an example of the second level shifter included in the third switch unit of FIG. 4, according to an illustrative embodiment.

FIG. 7 is a circuit diagram showing an example of the second level shifter included in the third switch unit of FIG. 4, according to an illustrative embodiment.

Referring to FIG. 7, the second level shifter 231 includes a third NMOS transistor MN3, a fourth NMOS transistor MN4, a third PMOS transistor MP3, a fourth PMOS transistor MP4 and a second inverter INV2. The third PMOS transistor MP3 includes a gate receiving the third control signal CON3 and a source connected to the supply voltage VDD. The second inverter INV2 may invert the third control signal CON3. The fourth PMOS transistor MP4 includes a gate receiving an output signal of the second inverter INV2 and a source connected to the supply voltage VDD. The third NMOS transistor MN3 includes a source connected to the second node N2 to receive the negative high voltage VNEG, a gate connected to a drain of the fourth PMOS transistor MP4 and a drain connected to a drain of the third PMOS transistor MP3. The fourth NMOS transistor MN4 includes a source connected to the second node N2 to receive the negative high voltage VNEG, a gate connected to a drain of the third PMOS transistor MP3 and a drain connected to a drain of the fourth PMOS transistor MP4. The second level shifter 231 outputs the fifth control signal CON3C at the drain of the fourth PMOS transistor MP4.

Figure 8:
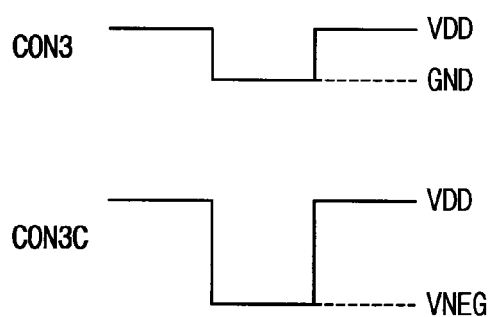
FIG. 8 shows examples of waveforms for describing an operation of the second level shifter of FIG. 7, according to an illustrative embodiment.

FIG. 8 shows waveforms for describing an operation of the second level shifter of FIG. 7, according to an illustrative embodiment.

Referring to FIGS. 7 and 8, when the third control signal CON3 is in a logic high state having the supply voltage VDD, the third PMOS transistor MP3 is turned off and the fourth PMOS transistor MP4 is turned on, such that a voltage of the drain of the fourth PMOS transistor MP4 is the supply voltage VDD. Therefore, the second level shifter 231 provides the fifth control signal CON3C in a logic high state having the supply voltage VDD.

When the third control signal CON3 is in a logic low state having the ground voltage GND, the third PMOS transistor MP3 is turned on and the fourth PMOS transistor MP4 is turned off, such that a voltage of the drain of the third PMOS transistor MP3 is the supply voltage VDD. Since the voltage of the drain of the third PMOS transistor MP3 is the supply voltage VDD, the fourth NMOS transistor MN4 is turned on, such that the voltage of the drain of the fourth PMOS transistor MP4 is the negative high voltage VNEG. Therefore, the second level shifter 231 provides the fifth control signal CON3C in a logic low state having the negative high voltage VNEG.

As described above, the second level shifter 231 may receive the third control signal CON3 and change a voltage level of the third control signal CON3 in a logic low state to generate the fifth control signal CON3C.

Figure 9:
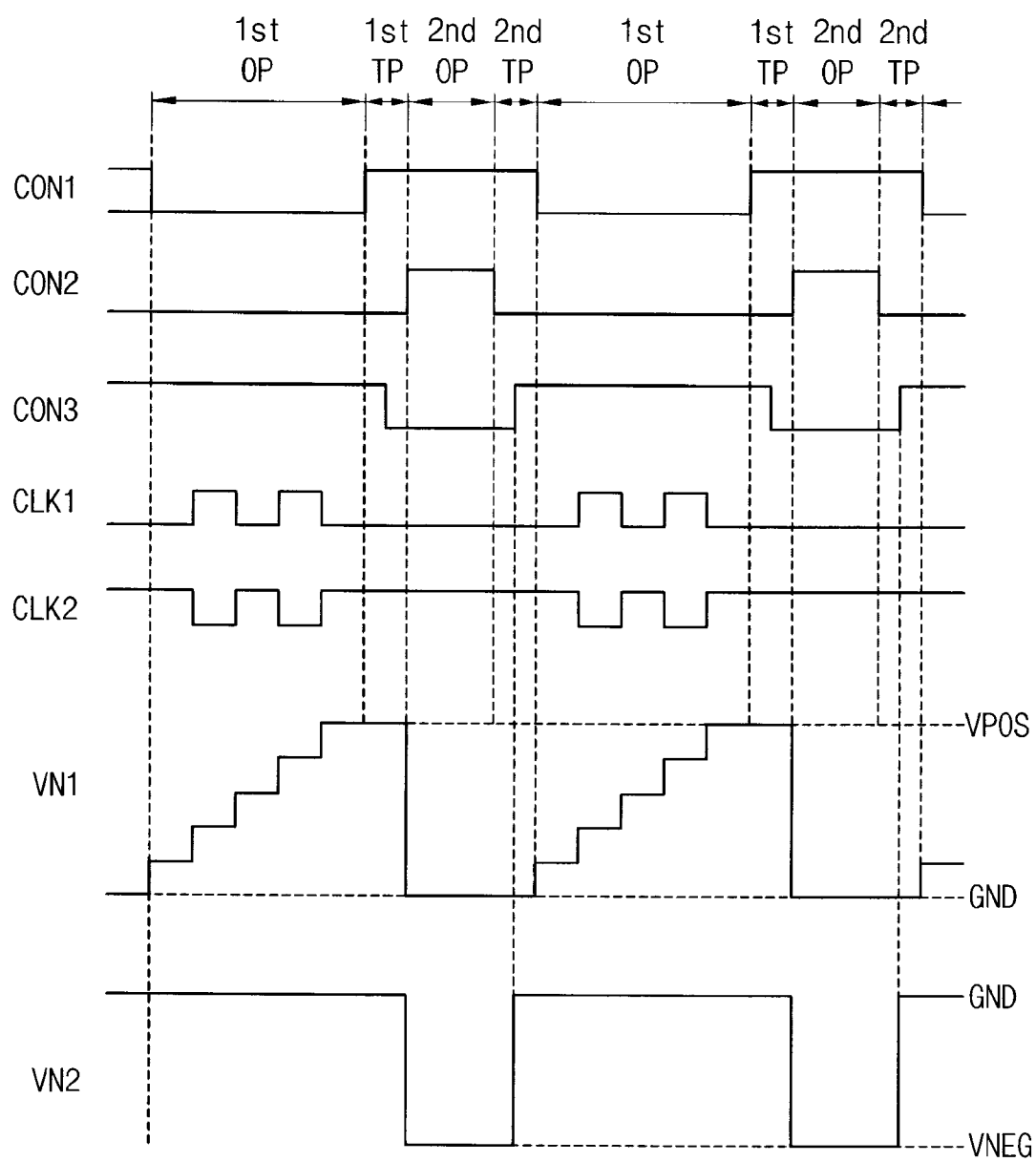
FIG. 9 is a timing diagram for describing an operation of a negative high voltage generator of FIG. 1, according to an illustrative embodiment.

FIG. 9 is a timing diagram for describing operation of the negative high voltage generator of FIG. 1, according to an illustrative embodiment.

Hereinafter, operation of the negative high voltage generator 1000 of FIG. 1 will be described with reference to FIGS. 1 to 9.

During a first operation period 1stOP, the first clock signal CLK1 and the second clock signal CLK2 toggle between the ground voltage GND and the supply voltage VDD with a phase difference of 180 degrees. Therefore, the charge providing unit 100 periodically provides the positive charges PC in predetermined amounts to the voltage conversion unit 200a at a rising edge and a falling edge of the first clock signal CLK1 and the second clock signal CLK2.

The first switch unit 210 and the third switch unit 230 are turned on and the second switch unit 220 is turned off during the first operation period 1stOP, since the first control signal CON1 and the second control signal CON2 are in a logic low level and the third control signal CON3 is in a logic high level during the first operation period 1stOP. Therefore, a voltage VN2 of the second node N2 is clamped to the ground voltage GND, and the positive charges PC periodically provided from the charge providing unit 100 are stored at the first electrode of the coupling capacitor 240. The voltage VN1 of the first node N1 increases as the positive charges PC are stored at the first electrode of the coupling capacitor 240. When the positive charges PC are fully stored at the first electrode of the coupling capacitor 240 in a predetermined amount, the voltage VN1 of the first node N1 is a positive high voltage VPOS.

During a first transition period 1stTP after the first operation period 1stOP, the first control signal CON1 changes to a logic high level, so that the first switch unit 210 is turned off. Therefore, the first electrode of the coupling capacitor 240 is floated since the second switch unit 220 is also turned off during the first transition period 1stTP. After that, the third control signal CON3 changes to a logic low level, so that the third switch unit 230 is turned off. Therefore, the second electrode of the coupling capacitor 240 is also floated. At the end of the first transition period 1stTP, the second control signal CON2 changes to a logic high level, so that the second switch unit 220 is turned on.

During a second operation period 2ndOP after the first transition period 1stTP, the first switch unit 210 and the third switch unit 230 are turned off and the second switch unit 220 is turned on since the first control signal CON1 and the second control signal CON2 are in a logic high level and the third control signal CON3 is in a logic low level during the second operation period 2ndOP. Therefore, the second node N2 is floated and the first node N1 is connected to the ground voltage GND, so that the positive charges PC stored at the first electrode of the coupling capacitor 240 are discharged to the ground voltage GND. As a result, the voltage VN1 of the first node N1 decreases from the positive high voltage VPOS to the ground voltage GND and the voltage VN2 of the second node N2 decreases from the ground voltage GND to the negative high voltage VNEG. The magnitude of the negative high voltage VNEG may be substantially the same as the magnitude of the positive high voltage VPOS. Therefore, the voltage conversion unit 200a may provide the negative high voltage VNEG at the second electrode of the coupling capacitor 240 during the second operation period 2ndOP.

As described above, the first control signal CON1 is in a logic high level during the second operation period 2ndOP, so that the first switch unit 210 connected to the charge providing unit 100 is turned off. Therefore, the first clock signal CLK1 and the second clock signal CLK2 may stop toggling during the second operation period 2ndOP, so that the charge providing unit 100 stops outputting the positive charges PC.

During a second transition period 2ndTP after the second operation period 2ndOP, the second control signal CON2 changes to a logic low level, so that the second switch unit 220 is turned off. After that, the third control signal CON3 changes to a logic high level, so that the third switch unit 230 is turned on. Therefore, the voltage VN2 of the second node N2 is clamped to the ground voltage GND. At the end of the second transition period 2ndTP, the first control signal CON1 changes to a logic low level, so that the first switch unit 210 is turned on.

The negative high voltage generator 1000 may repeat the operation described above to provide the negative high voltage VNEG during the second operation period 2ndOP of every cycle.

Figure 10:
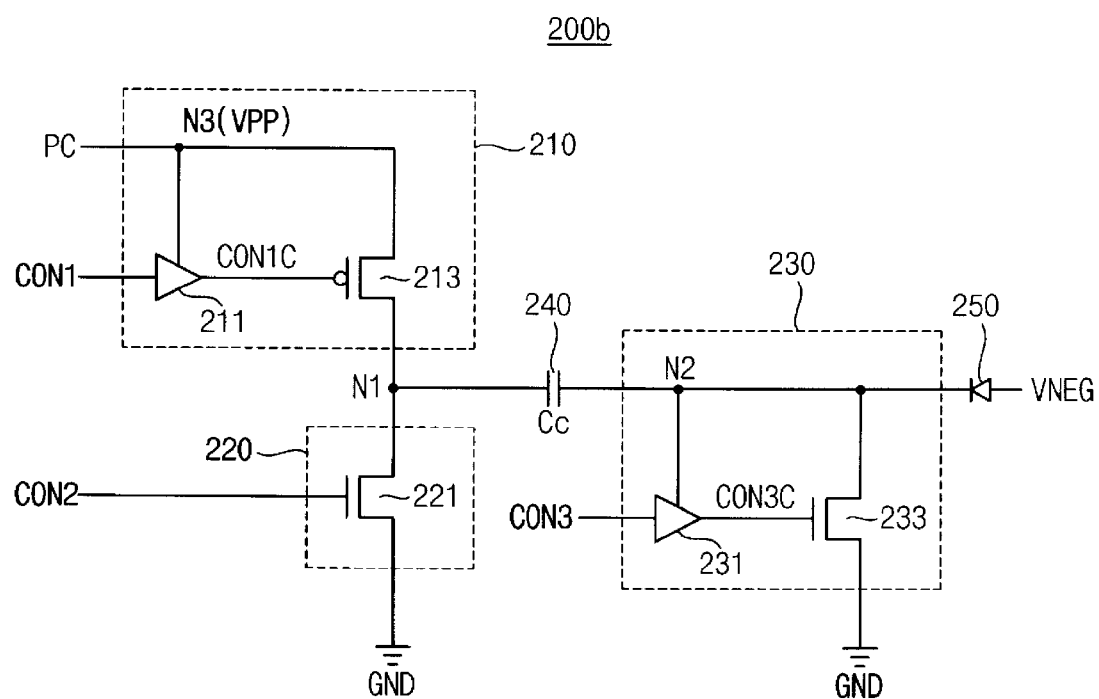
FIG. 10 is a circuit diagram showing another example of the voltage conversion unit of FIG. 1, according to an illustrative embodiment.

FIG. 10 is a circuit diagram showing another example of the voltage conversion unit of FIG. 1, according to an illustrative embodiment.

Referring to FIG. 10, the voltage conversion unit 200b includes the first switch unit 210, the second switch unit 220, the third switch unit 230, the coupling capacitor Cc 240 and a diode 250. The voltage conversion unit 200b is thus substantially the same as the voltage conversion unit 200a of FIG. 4, except for the diode 250. The structure and operation of the voltage conversion unit 200a of FIG. 4 are described above with reference to FIGS. 1 to 9. Therefore, a detail description of the first switch unit 210, the second switch unit 220, the third switch unit 230 and the coupling capacitor Cc 240 will not be repeated.

A cathode of the diode 250 is connected to the second electrode of the coupling capacitor 240 at the second node N2, an anode of the diode 250 is connected to an external device, for example. The diode 250 receives the negative high voltage VNEG from the second electrode of the coupling capacitor 240 at the cathode and provides the negative high voltage VNEG to the external device at the anode.

Referring again to FIG. 9, during the first operation period 1stOP, the voltage VN2 of the second node N2 is clamped to the ground voltage GND, causing the diode 250 to turn off. During the second operation period 2ndOP, the voltage VN2 of the second node N2 is the negative high voltage VNEG, causing the diode 250 to turn on. Therefore, the diode 250 may provide the negative high voltage VNEG to the external device to sink a current from the external device during the second operation period 2ndOP. That is, the diode 250 may block the voltage conversion unit 200b from the external device during the first operation period 1stOP and connect the voltage conversion unit 200b to the external device to provide the negative high voltage VNEG to the external device during the second operation period 2ndOP.

Figure 11:
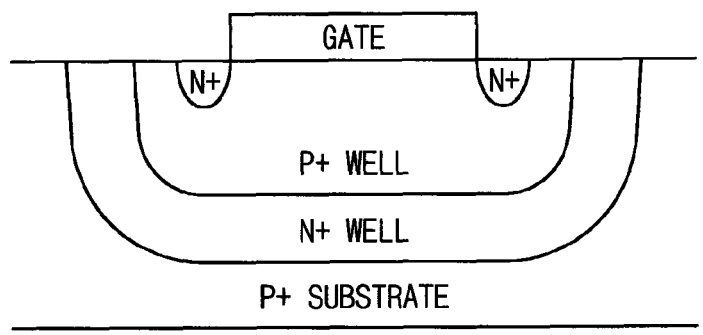
FIG. 11 is a cross-sectional view of an NMOS transistor included in a conventional negative high voltage generator.

FIG. 11 is a cross-sectional view of an NMOS transistor included in a conventional negative high voltage generator, and FIG. 12 is a cross-sectional view of an NMOS transistor included in a negative high voltage generator of FIG. 1, according to an illustrative embodiment.

The conventional negative high voltage generator amplifies a negative supply voltage using pumping stages, each of which includes an NMOS transistor formed on a P+ type silicon substrate to generate a negative high voltage. Each of the NMOS transistors included in the pumping stages amplifies a magnitude of a negative voltage received from a previous pumping stage and provides the amplified negative voltage to a next pumping stage. When a negative high voltage is applied to an NMOS transistor, a leakage current typically flows from a drain region of the NMOS transistor to the P+ type silicon substrate, so that the NMOS transistor cannot sufficiently amplify the magnitude of the negative high voltage. As illustrated in FIG. 11, to prevent the leakage current in the conventional negative high voltage generator, a P+ type well surrounds a source region and a drain region of the NMOS transistor and an N+ type well surrounds the P+ type well, formed in the P+ type silicon substrate. However, when the NMOS transistor has the structure as illustrated in FIG. 11, latch-up may occur and the size of the NMOS transistor may increase.

In contrast, the negative high voltage generator 1000 according to various embodiments generates the positive high voltage VPOS using the positive supply voltage VDD and then inverts the polarity of the positive high voltage VPOS using the coupling capacitor 240 to generate the negative high voltage VNEG, so that a negative voltage is not applied to the NMOS transistors M1, M2, M3, M4 and M5 included in the charge providing unit 100. Therefore, as illustrated in FIG. 12, the plurality of the NMOS transistors M1, M2, M3, M4 and M5 included in the charge providing unit 100 may include an N+ type source and an N+ type drain that are directly formed in a P+ type substrate, i.e., without the P+ type well and the N+ type well of FIG. 11. As a result, the negative high voltage generator 1000 according to various embodiments has a relatively small size and is able to avoid latch-up.

Figure 13:
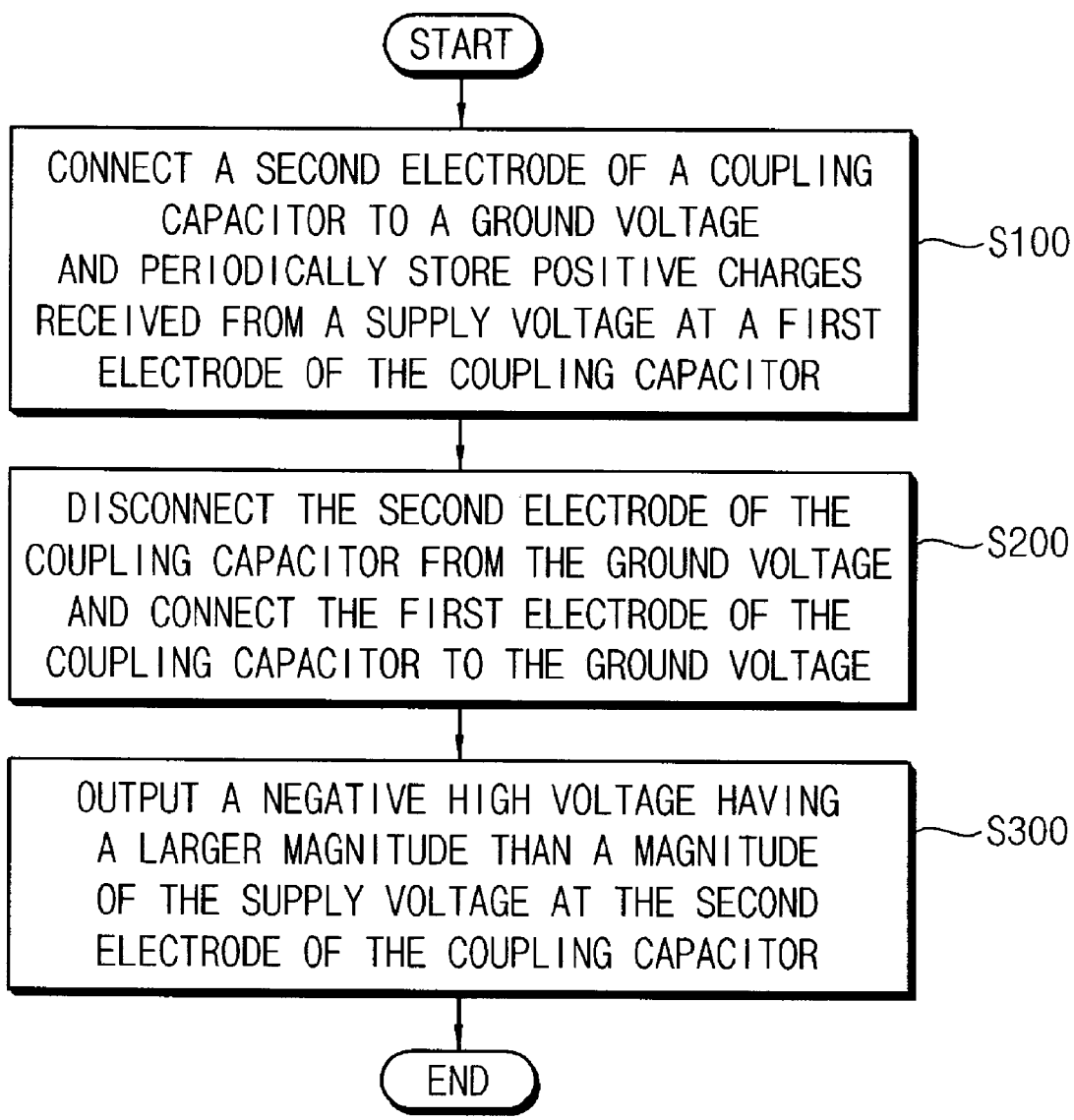
FIG. 13 is a flow chart showing a method of generating a negative high voltage, according to illustrative embodiments.

FIG. 13 is a flow chart showing a method of generating a negative high voltage, according to illustrative embodiments.

Referring to FIG. 13, a second electrode of a coupling capacitor is connected to a ground voltage and positive charges provided from a supply voltage are periodically stored at a first electrode of the coupling capacitor (step S100). A voltage of the first electrode of the coupling capacitor increases as the positive charges are stored at the first electrode of the coupling capacitor. When the positive charges are fully stored at the first electrode of the coupling capacitor, the voltage of the first electrode of the coupling capacitor may be a positive high voltage having a magnitude larger than a magnitude of the supply voltage. The second electrode of the coupling capacitor is then disconnected from the ground voltage and the first electrode of the coupling capacitor is connected to the ground voltage (step S200). The voltage of the first electrode of the coupling capacitor decreases from the positive high voltage to the ground voltage and the voltage of the second electrode of the coupling capacitor decreases from the ground voltage to a negative high voltage. A magnitude of the negative high voltage may be substantially the same as the magnitude of the positive high voltage. Thus, the negative high voltage, the magnitude of which is larger than the magnitude of the supply voltage, is output at the second electrode of the coupling capacitor (step S300).

Figure 14:
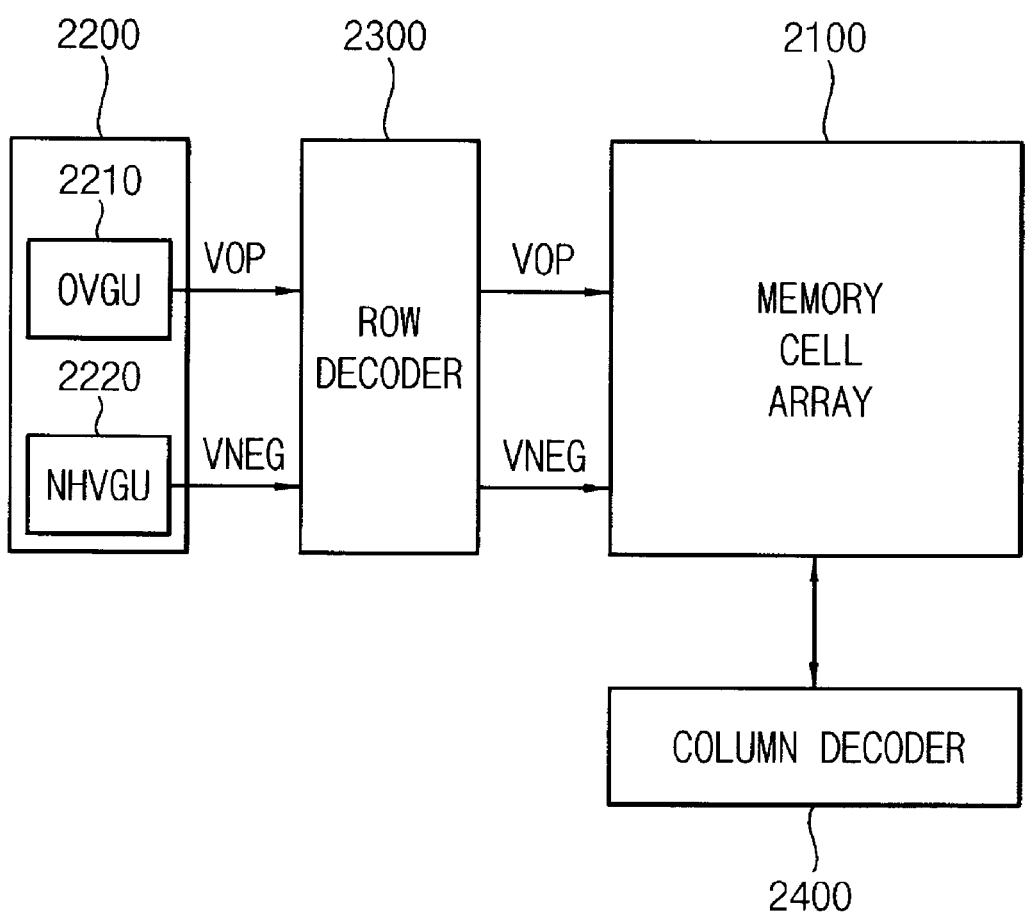
FIG. 14 is a block diagram showing a non-volatile memory device, according to illustrative embodiments.

FIG. 14 is a block diagram showing a non-volatile memory device, according to illustrative embodiments.

Referring to FIG. 14, a non-volatile memory device 2000 includes a memory cell array 2100, a voltage providing unit 2200 and a row decoder 2300. The memory cell array 2100 includes multiple memory cells. The row decoder 2300 provides an operating voltage VOP and a negative high voltage VNEG to the memory cell array 2100 to perform program operations, program verification operations and read operations on the memory cell array 2100. The voltage providing unit 2200 includes an operating voltage generator OVGU 2210 that generates the operating voltage VOP and a negative high voltage generator NHVGU 2220 that generates the negative high voltage NVEG. The non-volatile memory device 2000 may further include a column decoder 2400 that provides write data to the memory cell array 2100 and outputs read data received from the memory cell array 2100.

The negative high voltage generator NHVGU 2220 includes a charge providing unit and a voltage conversion unit. The charge providing unit periodically outputs a predetermined amount of positive charges received from a supply voltage. The voltage conversion unit stores the positive charges and discharges the stored positive charges to a ground voltage to generate the negative high voltage VNEG having a magnitude larger than a magnitude of the supply voltage.

The negative high voltage generator NHVGU 2220 may be implemented as the negative high voltage generator 1000 of FIG. 1. The structure and operation of the negative high voltage generator 1000 of FIG. 1 are described above with reference to FIGS. 1 to 12. Therefore, the detailed description will not be repeated.

Figure 15:
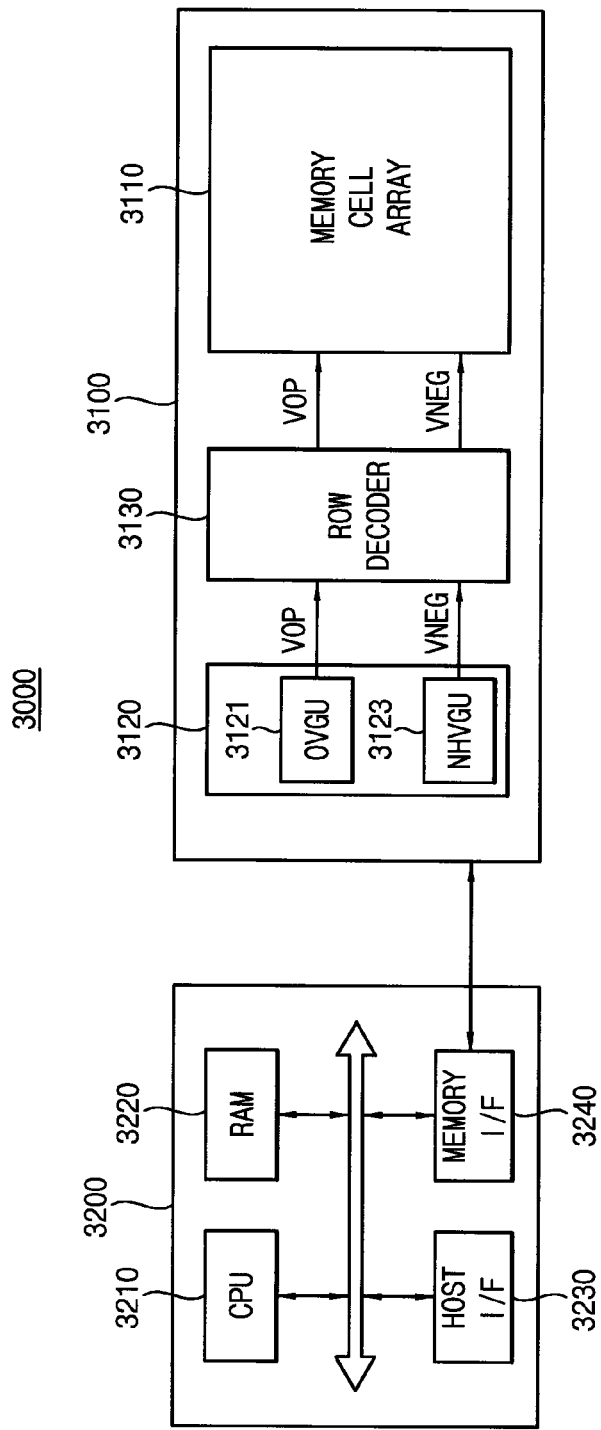
FIG. 15 is a block diagram showing a non-volatile memory system including the non-volatile memory device of FIG. 14, according to an illustrative embodiment.

FIG. 15 is a block diagram showing a non-volatile memory system including the non-volatile memory device of FIG. 14, according to illustrative embodiments.

Referring to FIG. 15, a non-volatile memory system 3000 includes a non-volatile memory device 3100 and a memory controller 3200.

The non-volatile memory device 3100 includes a memory cell array 3110, a voltage providing unit 3120 and a row decoder 3130. The memory cell array 3110 includes multiple memory cells. The row decoder 3130 provides an operating voltage VOP and a negative high voltage VNEG to the memory cell array 3110 to perform program operations, program verification operations and read operations on the memory cell array 3110. The voltage providing unit 3120 includes an operating voltage generator OVGU 3121 that generates the operating voltage VOP and a negative high voltage generator NHVGU 3123 that generates the negative high voltage NVEG.

The negative high voltage generator NHVGU 3123 includes a charge providing unit and a voltage conversion unit. The charge providing unit periodically outputs a predetermined amount of positive charges received from a supply voltage. The voltage conversion unit stores the positive charges and discharges the stored positive charges to a ground voltage to generate the negative high voltage VNEG having a magnitude larger than a magnitude of the supply voltage.

The non-volatile memory device 3100 may be implemented as the non-volatile memory device 2000 of FIG. 14. The structure and operation of the non-volatile memory device 2000 of FIG. 14 are described above with reference to FIGS. 1 to 12 and 14. Therefore, the detailed description will not be repeated.

The memory controller 3200 controls operations of the non-volatile memory device 3100, including data transfer operations between the non-volatile memory device 3100 and an external host, for example. The memory controller 3200 includes a central processing unit (CPU) 3210, a buffer memory, e.g., random access memory (RAM) 3220, a host interface 3230 and a memory interface 3240. The central processing unit 3210 performs the data transfer operation. The host interface 3230 may be coupled to the external host, for example, and the memory interface 3240 may be coupled to the non-volatile memory device 3100. The central processing unit 3210 communicates with the external host through the host interface 3230. The central processing unit 3210 controls the non-volatile memory device 3100 through the memory interface 3240. The RAM 3220 temporally stores data that are provided from the external host or read from the non-volatile memory device 3100.

According to various embodiments, the memory controller 3200 may further include a non-volatile memory device that stores start-up codes and/or an error correction (ECC) block for correcting errors. The buffer memory 3220 may be implemented with a dynamic random access memory (DRAM), a static random access memory (SRAM), a phase-change random access memory (PRAM), a ferroelectric random access memory (FRAM), a resistive random access memory (RRAM), a magnetic random access memory (MRAM), etc. The RAM 3220 may be an operation memory of the central processing unit 3210.

The non-volatile memory system 3000 may be a memory card or a solid state drive/disk (SSD). The memory controller 3200 may communicate with the external host using interfaces such as Universal Serial Bus (USB), Multimedia Card (MMC) interface, Advance Technology Attachment (ATA), Serial-ATA, Parallel-ATA, Small Computer System Interface (SCSI), Enhanced Small Disk Interface (ESDI), Integrated Drive Electronics (IDE), etc.

The non-volatile memory device 3100 and/or the memory controller 3200 may be mounted together using various packages. For example, the non-volatile memory device 3100 and/or the memory controller 3200 may be mounted using Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

Figure 16:
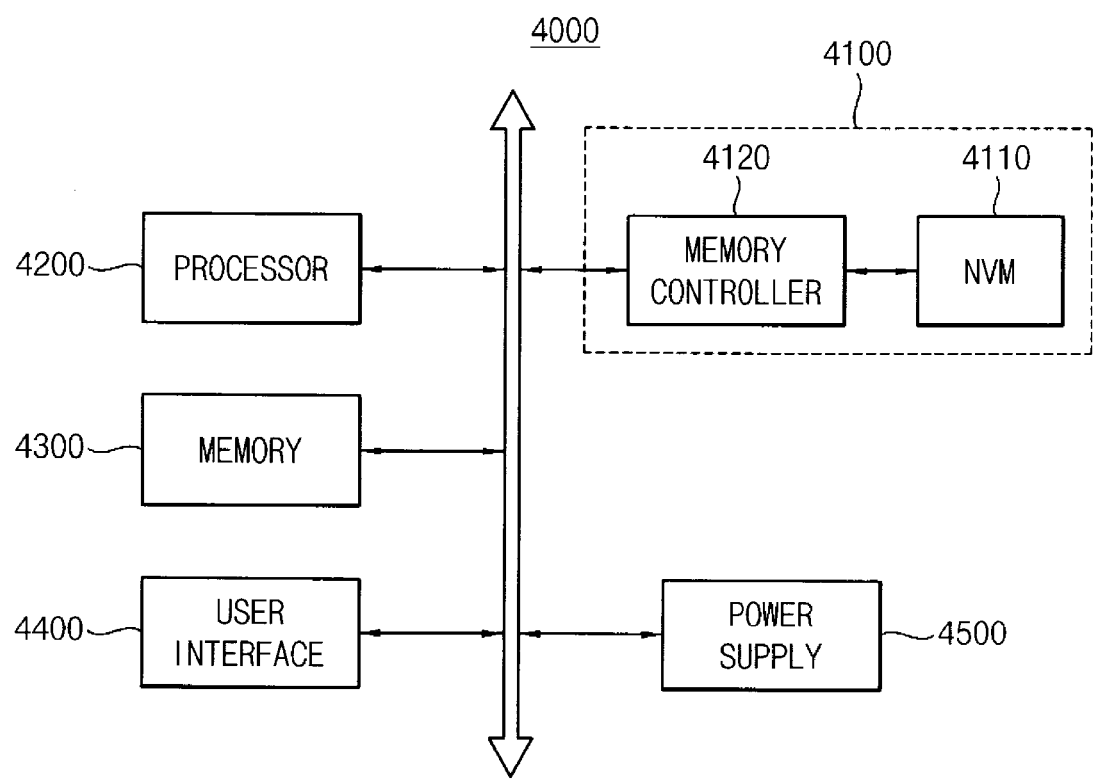
FIG. 16 is a block diagram showing a computing system including the non-volatile memory system of FIG. 15, according to an illustrative embodiment.

FIG. 16 is a block diagram showing a computing system including the non-volatile memory system of FIG. 15, according to illustrative embodiments.

Referring to FIG. 16, a computing system 4000 includes a non-volatile memory system 4100, a processor 4200, a memory device 4300 and a user interface 4400.

The non-volatile memory system 4100 includes a non-volatile memory device NVM 4110 and a memory controller 4120. The non-volatile memory system 4100 may be implemented as the non-volatile memory system 3000 of FIG. 15. The structure and operation of the non-volatile memory system 3000 of FIG. 15 are described above with reference to FIGS. 1 to 12, 14 and 15. Therefore, the detailed description will not be repeated.

The processor 4200 may perform various computing functions, such as executing specific software for performing specific calculations or tasks. For example, the processor 4200 may be a microprocessor or a central process unit. The processor 4200 may be connected to the non-volatile memory system 4100, the memory device 4300 and the user interface 4400 via a bus, such as an address bus, a control bus or a data bus, etc. For example, the memory device 4300 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

In addition, the processor 4200 may be connected to an extended bus, such as a peripheral component interconnect (PCI) bus. As such, the processor 4200 may control the user interface 4400 including at least one input device (e.g., a keyboard and a mouse) and/or at least one output device (e.g., a printer and a display device). Data, which are provided through the user interface 4400 or processed by the processor 4200, may be stored in the non-volatile memory device 4110 through the memory controller 4120. The computing system 4000 further includes a power supply 4500 for supplying operational power. The computing system 4000 may further include an application chipset, a camera image processor, a mobile DRAM, etc.

The computing system 4000 according to various embodiments may be a cellular phone, a Personal Digital Assistant (PDA), a digital camera, a portable game console, a MP3 player, a desktop computer, a laptop (or a notebook computer), a video player, a television, etc.

As described above, a negative high voltage generator and a non-volatile memory device according to various embodiments generates a negative high voltage using a positive supply voltage, and thus be implemented in a relatively small size without occurring latch-up.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A negative high voltage generator, comprising:
a charge providing unit configured to periodically output a predetermined amount of positive charges received from a supply voltage; and
a voltage conversion unit configured to store the positive charges and to discharge the stored positive charges to a ground voltage to generate a negative high voltage having a magnitude larger than a magnitude of the supply voltage,
wherein the voltage conversion unit comprises:
a first switch unit configured to turn on in response to a first control signal to transfer the positive charges;
a coupling capacitor having a first electrode and a second electrode, the coupling capacitor being configured to store the positive charges received from the first switch unit at the first electrode and to provide the negative high voltage at the second electrode;

a second switch unit configured to turn on in response to a second control signal to discharge the stored positive charges from the first electrode of the coupling capacitor to the ground voltage; and a third switch unit configured to turn on in response to a third control signal to connect the second electrode of the coupling capacitor to the ground voltage.

2. The negative high voltage generator of claim 1, wherein the first switch unit comprises:

a first level shifter configured to receive the first control signal and to change a voltage level of the first control signal in a logic high state; and a P-type metal oxide semiconductor (PMOS) transistor having a gate receiving an output signal of the first level shifter, a source receiving the positive charges and a drain connected to the first electrode of the coupling capacitor.

3. The negative high voltage generator of claim 1, wherein the second switch unit comprises an N-type metal oxide semiconductor (NMOS) transistor having a gate receiving the second control signal, a drain connected to the first electrode of the coupling capacitor and a source connected to the ground voltage.

4. The negative high voltage generator of claim 1, wherein the third switch unit comprises:

a second level shifter configured to receive the third control signal and to change a voltage level of the third control signal to a logic low state; and an NMOS transistor having a gate receiving an output signal of the second level shifter, a drain connected to the second electrode of the coupling capacitor and a source connected to the ground voltage.

5. The negative high voltage generator of claim 1, wherein the first switch unit and the third switch unit are turned on and the second switch unit is turned off to store the positive charges at the first electrode of the coupling capacitor during a first operation period, and the first switch unit and the third switch unit are turned off and the second switch unit is turned on to discharge the stored positive charges from the first electrode of the coupling capacitor to the ground voltage during a second operation period.

6. The negative high voltage generator of claim 5, wherein the first switch unit is turned off, the third switch unit is turned off, and then the second switch unit is turned on in that order during a first transition period, the first transition period being after the first operation period and before the second operation period, and wherein the second switch unit is turned off, the third switch unit is turned on, and then the first switch unit is turned on in that order during a second transition period, the second transition period being after the second operation period and before the first operation period.

7. The negative high voltage generator of claim 5, wherein the voltage conversion unit provides the negative high voltage at the second electrode of the coupling capacitor during the second operation period.

8. The negative high voltage generator of claim 5, wherein the charge providing unit stops outputting the positive charges during the second operation period.

9. The negative high voltage generator of claim 1, wherein the voltage conversion unit further comprises:

a diode having a cathode and an anode, the cathode of the diode being connected to the second electrode of the coupling capacitor such that the diode receives the negative high voltage from the second electrode of the coupling capacitor at the cathode and provides the negative high voltage to an external device at the anode.

10. A negative high voltage generator, comprising:

a charge providing unit configured to periodically output a predetermined amount of positive charges received from a supply voltage; and a voltage conversion unit configured to store the positive charges and to discharge the stored positive charges to a ground voltage to generate a negative high voltage having a magnitude larger than a magnitude of the supply voltage, wherein the charge providing unit comprises:

a plurality of N-type metal oxide semiconductor (NMOS) transistors connected in series, each of the plurality of NMOS transistors being diode connected, a first NMOS transistor that is connected at first stage among the plurality of NMOS transistors receiving the supply voltage; and a plurality of boost capacitors respectively including first and second electrodes, the first electrodes of the plurality of boost capacitors being connected to nodes between adjacent NMOS transistors of the plurality of NMOS transistors, respectively.

11. The negative high voltage generator of claim 10, wherein the second electrodes of first boost capacitors that are connected at odd stages among the plurality of boost capacitors receive a first clock signal, and the second electrodes of second boost capacitors that are connected at even stages among the plurality of boost capacitors receive a second clock signal, the second clock signal being an inverted version of the first clock signal, wherein the first clock signal and the second clock signal toggle between the ground voltage and the supply voltage.

12. The negative high voltage generator of claim 11, wherein a last NMOS transistor that is connected at a last stage among the plurality of NMOS transistors outputs the positive charges at a rising edge and a falling edge of the first clock signal and the second clock signal, respectively.

13. The negative high voltage generator of claim 10, wherein each of the plurality of NMOS transistors comprises an N+ type source and an N+ type drain that are directly formed in a P+ type substrate.

14. A non-volatile memory device, comprising:

a memory cell array comprising a plurality of memory cells;

a row decoder configured to provide an operating voltage and a negative high voltage to the memory cell array to perform at least one of a program operation, a program verification operation and a read operation on the memory cell array; and a voltage providing unit comprising an operating voltage generator configured to generate the operating voltage and a negative high voltage generator configured to generate the negative high voltage, the negative high voltage generator comprising:

a charge providing unit configured to periodically output a predetermined amount of positive charges received from a supply voltage; and a voltage conversion unit configured to store the positive charges and discharge the stored positive charges to a ground voltage to generate the negative high voltage having a magnitude larger than a magnitude of the supply voltage, wherein the voltage conversion unit of the negative high voltage generator comprises:

a first switch unit configured to selectively transfer positive charges in response to a first control signal;

a coupling capacitor having a first electrode and a second electrode, the coupling capacitor being configured to store the positive charges received from the first switch unit at the first electrode and to provide the negative high voltage at the second electrode;

a second switch unit configured to selectively discharge the stored positive charges from the first electrode of the coupling capacitor to the ground voltage in response to a second control signal; and a third switch unit configured to selectively connect the second electrode of the coupling capacitor to the ground voltage in response to a third control signal.

* * * * *